(12) United States Patent
Bassett et al.

(10) Patent No.: US 10,062,586 B2
(45) Date of Patent: Aug. 28, 2018

(54) CHEMICAL FLUID PROCESSING APPARATUS AND CHEMICAL FLUID PROCESSING METHOD

(71) Applicant: Tokyo Electron Limited, Minato-ku, Tokyo (JP)

(72) Inventors: Derek W Bassett, Austin, TX (US); Wallace P Printz, Austin, TX (US); Gentaro Goshi, Kumamoto (JP); Hisashi Kawano, Kumamoto (JP); Yoshihiro Kai, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 248 days.

(21) Appl. No.: 14/338,656

(22) Filed: Jul. 23, 2014

(65) Prior Publication Data
US 2015/0031214 A1 Jan. 29, 2015

Related U.S. Application Data

(60) Provisional application No. 61/859,112, filed on Jul. 26, 2013.

(51) Int. Cl.
*H01L 21/67* (2006.01)
*H01L 21/306* (2006.01)
*H01L 21/3213* (2006.01)

(52) U.S. Cl.
CPC .... *H01L 21/6708* (2013.01); *H01L 21/30604* (2013.01); *H01L 21/32134* (2013.01)

(58) Field of Classification Search
USPC ............ 156/345.21, 345.22, 345.55, 345.52, 156/345.37; 118/730; 438/747
See application file for complete search history.

(56) References Cited

U.S. PATENT DOCUMENTS 5,571,560 A * 11/1996 Lin ..................... B05C 5/0208
118/305
6,827,814 B2 * 12/2004 Taniyama et al. ....... 156/345.12
(Continued)

FOREIGN PATENT DOCUMENTS

| JP | 2000199084 | 7/2000 |
| JP | 2003115474 | 4/2003 |

(Continued)

OTHER PUBLICATIONS

Machine Generated English Translation of JP 2003-115474. Apr. 18, 2003.*

(Continued)

*Primary Examiner* — Sylvia MacArthur
(74) *Attorney, Agent, or Firm* — Wood Herron & Evans LLP

(57) ABSTRACT

A chemical fluid processing apparatus and a chemical fluid processing method are described, to treat a substrate with a plurality of chemical fluids such that substantially constant temperature is maintained across a substrate surface. The apparatus includes a discharge nozzle above the substrate to supply a first chemical fluid at a first temperature to a front surface of the substrate, a bar nozzle oriented in a radial direction of the substrate to supply a second chemical fluid at a second temperature to the front surface or a back surface of the substrate, the second temperature being higher than the first temperature, and where the bar nozzle includes a plurality of outlets for discharging the second chemical fluid to a plurality of contacting places on the front surface or the back surface of the substrate at different distances from the center of the substrate.

13 Claims, 9 Drawing Sheets

(56) References Cited

U.S. PATENT DOCUMENTS

| | | | |
|---|---|---|---|
| 8,267,103 B2* | 9/2012 | Park et al. | 134/200 |
| 8,696,863 B2* | 4/2014 | Higashijima et al. | 156/345.55 |
| 8,828,183 B2* | 9/2014 | Namba et al. | 156/345.21 |
| 2003/0092264 A1* | 5/2003 | Kajita | C23C 18/1619 |
| | | | 438/689 |
| 2008/0083501 A1* | 4/2008 | Arai et al. | 156/345.21 |
| 2010/0181290 A1 | 7/2010 | Namba et al. | |
| 2012/0248061 A1 | 10/2012 | Brown et al. | |
| 2014/0227884 A1* | 8/2014 | Engesser | H01L 21/67248 |
| | | | 438/747 |
| 2015/0031214 A1* | 1/2015 | Bassett et al. | 438/747 |

FOREIGN PATENT DOCUMENTS

| | | |
|---|---|---|
| JP | 200414844 | 1/2004 |
| JP | 2005217226 | 8/2005 |
| TW | 201250817 A1 | 12/2012 |
| TW | 201550817 | 12/2012 |

OTHER PUBLICATIONS

Machine Generated English Translation of JP 2005-217226. Aug. 11, 2005.*

Machine Generated English Translation of JP 2000-199084 published Jul. 18, 2000.*

Machine Generated English Translation of JP 2004-014844. Published Jan. 15, 2004.*

Machine Generated English Translation of JP 2000-199084. Published Jul. 18, 2000 held to Goto Juichi et al.*

Japan Patent Office, Official Action issued in corresponding JP Patent Application 2014-151519 dated Aug. 11, 2015, 6 pp. including English translation.

Taiwan Intellectual Property Office, Notification of Examination Opinion issued in counterpart Taiwan Application No. 103125513, dated Jan. 29, 2016, 15 pp. including English translation.

Taiwan Intellectual Property Office, Office Action issued in counterpart Application No. 103125513, dated Aug. 30, 2016, 17 pp. including English translation.

* cited by examiner

| Run | Top | Bottom Hole Angle | Bottom Hole Pitch | Temperature Range [°C] |
|---|---|---|---|---|
| (D) | Center Dispense | -na- | -na- | 5.1 |
| (C) | Center Dispense | 90° | Constant | 3.7 |
| (B) | Center Dispense | 60° | Constant | 1.9 |
| (A) | Center Dispense | 60° | Variable (Denser to Edge) | 1.1 |

CHEMICAL FLUID PROCESSING APPARATUS AND CHEMICAL FLUID PROCESSING METHOD

CROSS-REFERENCE TO RELATED APPLICATIONS

This application is related to and claims priority to U.S. Provisional application Ser. No. 61/859,112 filed on Jul. 26, 2013, the entire contents of which are herein incorporated by reference.

FIELD OF INVENTION

The present disclosure relates to a chemical fluid processing apparatus and a chemical fluid processing method to treat a substrate, such as a semiconductor wafer, by treating the substrate with a high-temperature chemical fluid.

BACKGROUND OF THE INVENTION

Many processes for manufacturing a semiconductor device include treating a substrate with a chemical fluid, for example when removing a film formed on a semiconductor wafer by etching with a chemical liquid. In one example, a SiN film used as a hard mask may be removed from a wafer with hydrofluoric acid (HF) or a Si-based film may be removed with ammonia or an ammonia-hydrogen peroxide solution.

In a single-wafer film etch process, a chemical fluid is dispensed on the center of a rotating wafer and the chemical liquid flows across the wafer surface from the center of the wafer to the edge of the wafer. However, the chemical liquid cools as it flows across wafer and this is problematic since etch rate of a film on the substrate depends on the temperature of the liquid and the substrate and this can cause poor etch uniformity between the center of the substrate and the edge of the substrate. This problem becomes more pronounced as the substrate size increases.

SUMMARY OF THE INVENTION

Embodiments of the invention describe a chemical fluid processing apparatus and a chemical fluid processing method to treat a substrate. According to one embodiment, a chemical fluid processing apparatus is provided to treat a substrate with a plurality of chemical fluids such that substantially constant temperature is maintained across a substrate surface. The apparatus includes a substrate holding mechanism to hold the substrate, a rotating mechanism to rotate the substrate holding mechanism, a discharge nozzle above the substrate to supply a first chemical fluid at a first temperature to a front surface of the substrate, and a first chemical fluid supply mechanism to supply the first chemical fluid to the discharge nozzle. The apparatus further includes a bar nozzle oriented in a radial direction of the substrate to supply a second chemical fluid at a second temperature to the front surface or a back surface of the substrate, the second temperature being higher than the first temperature, and a second chemical fluid supply mechanism to supply the second chemical fluid to the bar nozzle, where the bar nozzle includes a plurality of outlets for discharging the second chemical fluid to a plurality of contacting places on the front surface or the back surface of the substrate at different distances from the center of the substrate.

According to another embodiment, a chemical fluid processing method is provided to treat a substrate with a plurality of chemical fluids such that substantially constant temperature is maintained across a substrate surface. The method includes holding the substrate, rotating the substrate, supplying a first chemical fluid from a discharge nozzle to a front surface of the substrate, and supplying a second chemical fluid from a bar nozzle to the front surface or a back surface of the substrate. The bar nozzle is oriented in a radial direction of the substrate to supply the second chemical fluid at a second temperature, the second temperature being higher than first temperature, where the second chemical fluid is supplied so that the second chemical fluid is discharged from the at least on bar nozzle through a plurality of outlets to a plurality of contacting places on the front surface or the back surface of the substrate at different distances from the center of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

In the following detailed description, reference is made to the accompanying drawings, which form a portion hereof.

The illustrative embodiments described in the detailed description, drawings, and claims are not meant to be limiting. Other embodiments may be utilized, and other changes may be made, without departing from the spirit or scope of the subject matter presented here.

The present disclosure provides a substrate processing apparatus and a substrate processing method for increasing the uniformity of treating a substrate by maintaining a substantially constant temperature across the substrate surface. The apparatus and processing method use less volume of chemical fluids compared to other apparatus and processing methods, while maintaining excellent temperature uniformity across a large substrate. The treating can include various processes commonly found in semiconductor manufacturing, including etching, cleaning, rinsing, depositing, and conditioning.

Figure 1A:
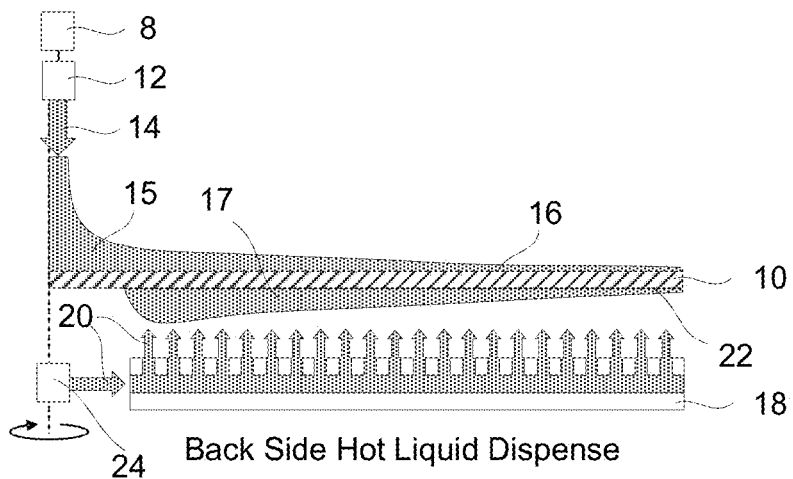
FIG. 1A is a cross-sectional view schematically illustrating treating a substrate with a plurality of chemical fluids according to a first embodiment.

FIG. 1A is a cross-sectional view schematically illustrating treating a substrate 10 with a plurality of chemical fluids according to a first embodiment. The substrate 10 can include a circular semiconductor wafer, for example a 200 mm, a 300 mm, or a 450 mm Si wafer. Further, other substrates, such as a substrate for a Flat Panel Display (FPD) including a glass substrate for a Liquid Crystal Display (LCD), a photolithography mask quartz substrate, may be used.

The substrate 10 is held by a holding mechanism (not shown) and the substrate 10 is rotated around the center of the substrate 10 by a rotating mechanism (not shown) configured to rotate the substrate holding mechanism. Substrate holding mechanisms and substrate rotating mechanisms are well known to those in the art. A discharge nozzle 12 is positioned above the substrate 10 to supply a first chemical fluid 14 at a first temperature to a front (upper) surface 16 of the substrate 10. A fluid profile 15 schematically is shown on the front surface 16. In one example, the discharge nozzle 12 can include a single outlet for dispensing the first chemical fluid 14 to the substrate 10. A first chemical fluid supply mechanism 8 supplies the first chemical fluid 14 to the discharge nozzle 12.

FIG. 1A further schematically illustrates a bar nozzle 18 that is oriented in a radial direction of the substrate 10 to supply a second chemical fluid 20 at a second temperature to a back (lower) surface 22 of the substrate, where the second temperature is higher than the first temperature. A second chemical fluid supply mechanism 24 supplies the second chemical fluid 20 to the bar nozzle 18. A fluid profile 17 is schematically shown on the back surface 22. During treating of the substrate 10, the first and second chemical fluids 14, 20 are simultaneously supplied to the substrate 10. The hotter second chemical fluid 20 counteracts cooling of the substrate 10 and keeps the temperature of the substrate 10 more uniform. For a film etch process, the improved substrate temperature uniformity improves the film etch uniformity across the substrate 10. The chemical fluid can include a gas, a liquid, or a combination thereof. The gas can include wide variety of gases, including inert gases such as Ar and $N_2$. Exemplary liquids are provided in TABLE I. In one example a water-based liquid containing hydrofluoric acid (HF) may be used to etch a nitride film such as SiN.

In one example, the front (upper) surface 16 of the substrate 10 can be an active surface where a treatment is being performed, and the back (lower) surface 22 of the substrate 10 can be a passive surface where the second chemical fluid 20 is only being applied to provide thermal energy which results in improved substrate temperature uniformity across the front surface 16. Thus, the second chemical fluid (passive fluid) 20 can have a chemical composition that is different from the chemical composition of the first chemical fluid 14. This allows the use of a second chemical fluid 20 that is less costly to supply or dispose of. In other examples, the active surface may be the back surface or both the front and back surfaces.

Figure 1B:
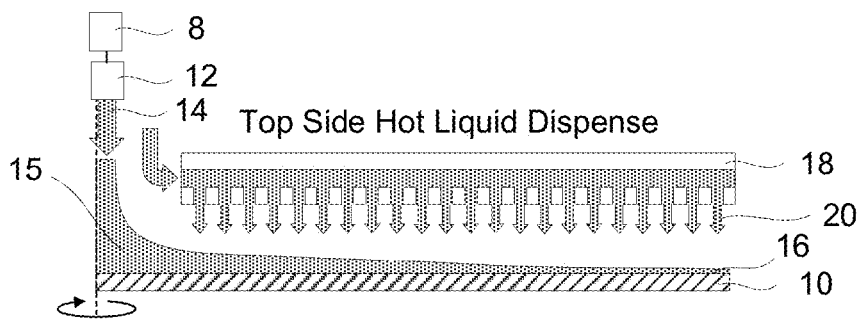
FIG. 1B is a cross-sectional view schematically illustrating treating a substrate with a plurality of chemical fluids according to a second embodiment.

FIG. 1B is a cross-sectional view schematically illustrating treating a substrate with a plurality of chemical fluids according to a second embodiment. The embodiment in FIG. 1B is similar to the embodiment in FIG. 1A but the bar nozzle 18 is oriented in a radial direction of the substrate to supply a second chemical fluid at a second temperature to the front surface 16 of the substrate 10.

Figure 1C:
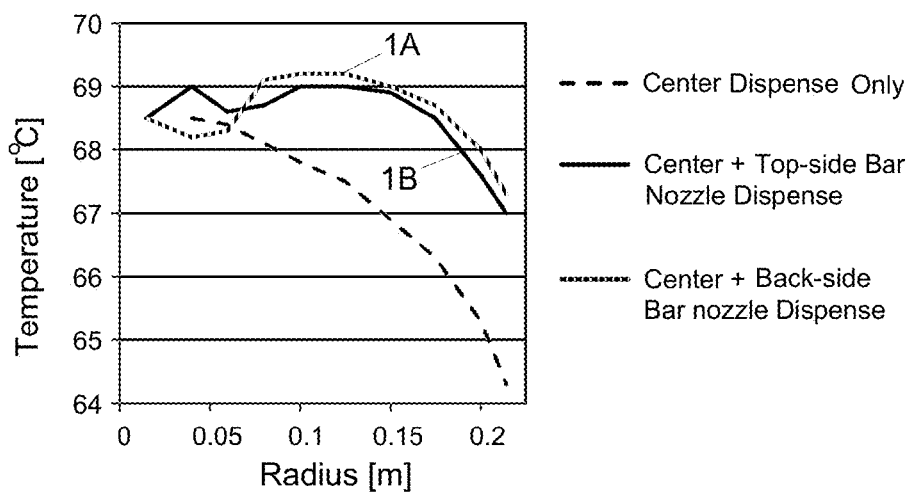
FIG. 1C shows experimental results of the temperature of a substrate as a function of radial position for the embodiments of FIGS. 1A and 1B.

FIG. 1C shows experimental results of the temperature of a substrate as a function of radial position of the substrate for the embodiments of FIGS. 1A and 1B. A 450 mm Si substrate (wafer) was treated with hot water liquid and the temperature across the substrate was measured and compared to a setup that only used a discharge nozzle and no bar nozzle. The temperature of fluid dispensed from the discharge nozzle was 70 degrees C. and the temperature of the fluid discharged from the bar nozzle was 79 degrees C. The results in FIG. 1C clearly show an improvement in the temperature uniformity across the substrate. The temperature variation across the substrate was about 4 degrees C. when using only the discharge nozzle, about 2 degrees C. when using a bar nozzle to also supply a second chemical fluid at a second temperature to a front surface of the substrate (1B), and about 2 degrees C. when using a bar nozzle to also supply a second chemical fluid at a second temperature to a back surface of the substrate (1A). This shows that the temperature uniformity was similar with front and backside bar nozzle dispensing. In addition to good temperature uniformity, backside dispensing allows the use of different fluids for the discharge nozzle and the backside bar nozzle. In one example, the discharge nozzle can dispense an etch liquid and the backside bar nozzle can dispense hot water instead of the etch liquid.

Experiments and iteration on the design of the bar nozzle have yielded significant improvements in the temperature uniformity across a substrate. In one example, changing the pitch of the outlets (holes) of the bar nozzle that dispense a chemical fluid to the substrate such that the outlets are denser towards the substrate edge than the substrate center has been shown to improve temperature uniformity across the substrate.

Figure 2A:
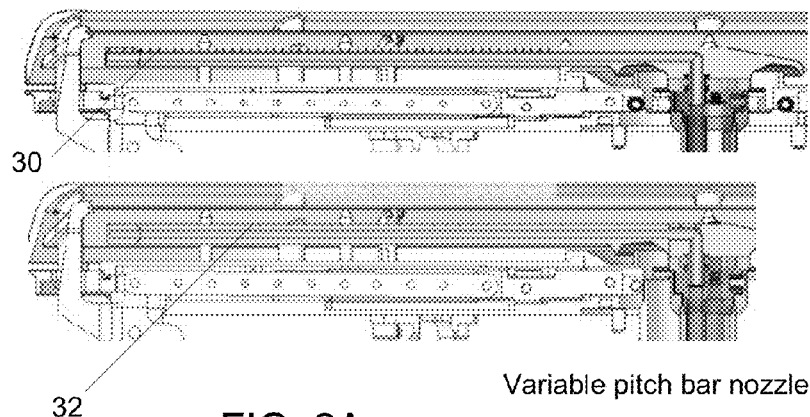
FIG. 2A schematically shows a bar nozzle containing outlets with a constant pitch and a bar nozzle containing outlets with a variable pitch according to embodiments of the invention.

FIG. 2A schematically shows a bar nozzle 30 containing outlets with a constant pitch and a bar nozzle 32 containing outlets with a variable pitch. In one example, the bar nozzles can include 58 outlets. However, in other examples, the bar nozzles can have fewer or more outlets. According to some embodiments, a diameter of the outlets can be between about 0.1 mm and about 2 mm, between about 0.1 mm and about 1 mm, or between about 1 mm and about 2 mm. In some examples, a diameter of the outlets can be about 0.35 mm or about 0.5 mm.

Figure 2B:
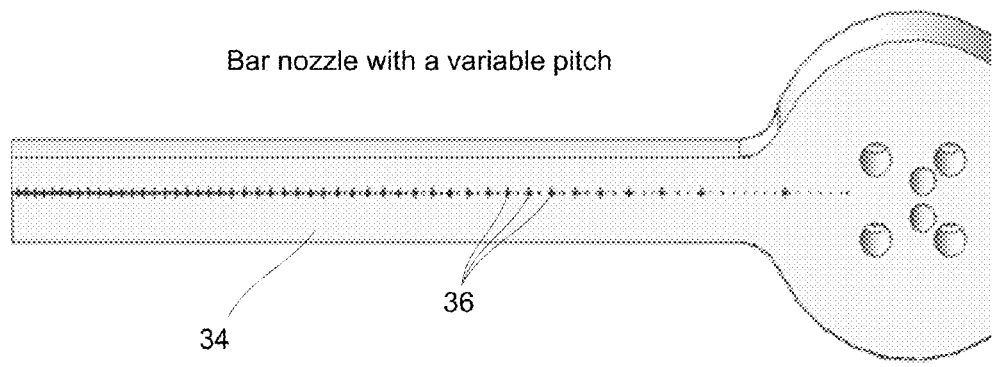
FIG. 2B schematically shows a bar nozzle containing outlets with a variable spacing that decreases from the center of a substrate to the edge of a substrate according to an embodiment of the invention.

FIG. 2B schematically shows a bar nozzle 34 containing outlets 36 with a variable pitch that increases from the center of a substrate to the edge of a substrate. In other words, the distance between adjacent outlets 36 varies along a direction from the center of the substrate to the edge of the substrate. In the example shown in FIG. 2B, the distance between adjacent outlets decreases along the radial direction from the center of the substrate to the edge of the substrate. In one example, the bar nozzle can include 58 outlets.

Figure 3:
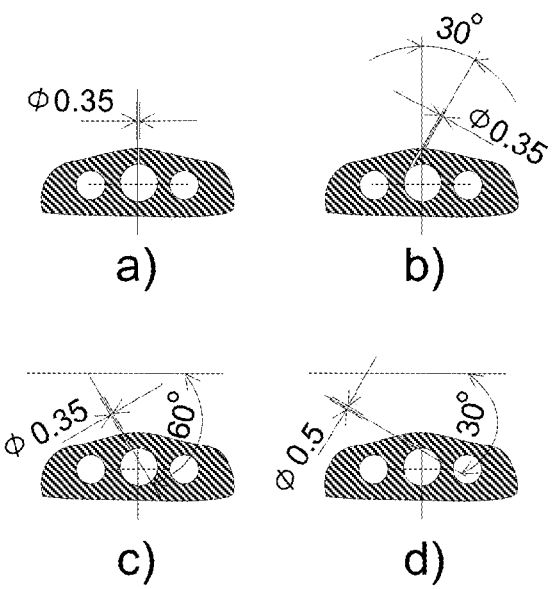
FIG. 3 schematically shows cross-sectional views of bar nozzles containing a plurality of outlets (holes) that are formed to proceed through a wall of a bar nozzle according to embodiments of the invention.

FIG. 3 schematically shows cross-sectional views of bar nozzles containing a plurality of outlets (holes) that are formed to proceed through a wall of a bar nozzle. Changing the angle of the holes away from vertical so they align with the rotation of the substrate has been found to reduce splashing and improve temperature uniformity performance across the substrate. Exemplary angles include 30 degrees and 60 degrees relative to the substrate surface, however, other angles may be used. FIG. 3a) schematically shows an vertical outlet with a diameter of 0.35 mm, FIG. 3b) schematically shows an outlet at 30 degrees from vertical and a diameter of 0.35 mm, FIG. 3c) schematically shows an outlet at 60 degrees from horizontal and a diameter of 0.35 mm, and FIG. 3d) schematically shows an outlet at 30 degrees from horizontal and a diameter of 0.5 mm.

Figure 4:
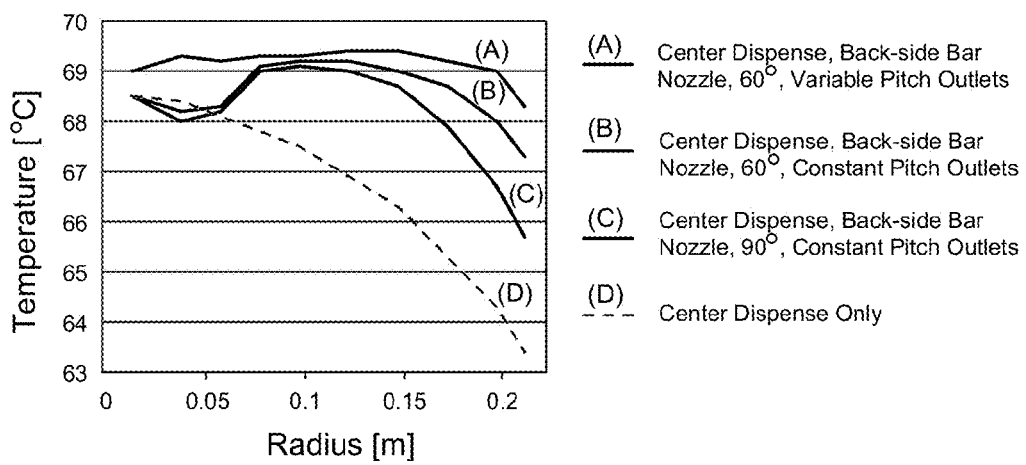
FIG. 4 shows measured temperature as a function of substrate radius when using bar nozzles with different outlet hole angles and different outlet pitch according to embodiments of the invention.

FIG. 4 shows measured temperature uniformity as a function of substrate radius for different outlet angles and different outlet pitch. The four experiments included: (A) discharge nozzle for dispensing a first chemical fluid to the front surface of the substrate, and backside bar nozzle with outlets at 60 degree angles and a variable (denser to substrate edge) pitch for dispensing a second chemical fluid to the back surface of the substrate, (B) discharge nozzle for dispensing a first chemical fluid to the front surface of the substrate, and backside bar nozzle with outlets at 60 degree angles and a constant pitch for dispensing a second chemical fluid to the back surface of the substrate, (C) discharge nozzle for dispensing a first chemical fluid to the front surface of the substrate, and backside bar nozzle with outlets at 90 degree angles and a constant pitch for dispensing a second chemical fluid to the back surface of the substrate, and (D) discharge nozzle for dispensing a first chemical fluid to the front surface of the substrate. The results in FIG. 4 show that the temperature uniformity across the substrate was highest for run (A) and lowest for (D). The temperature uniformity (range) was about 1.1 degree C. for (A), about 1.9 degree C. for (B), about 3.7 degrees C. for (C), and about 5.1 degrees C. for (D).

Figure 5:
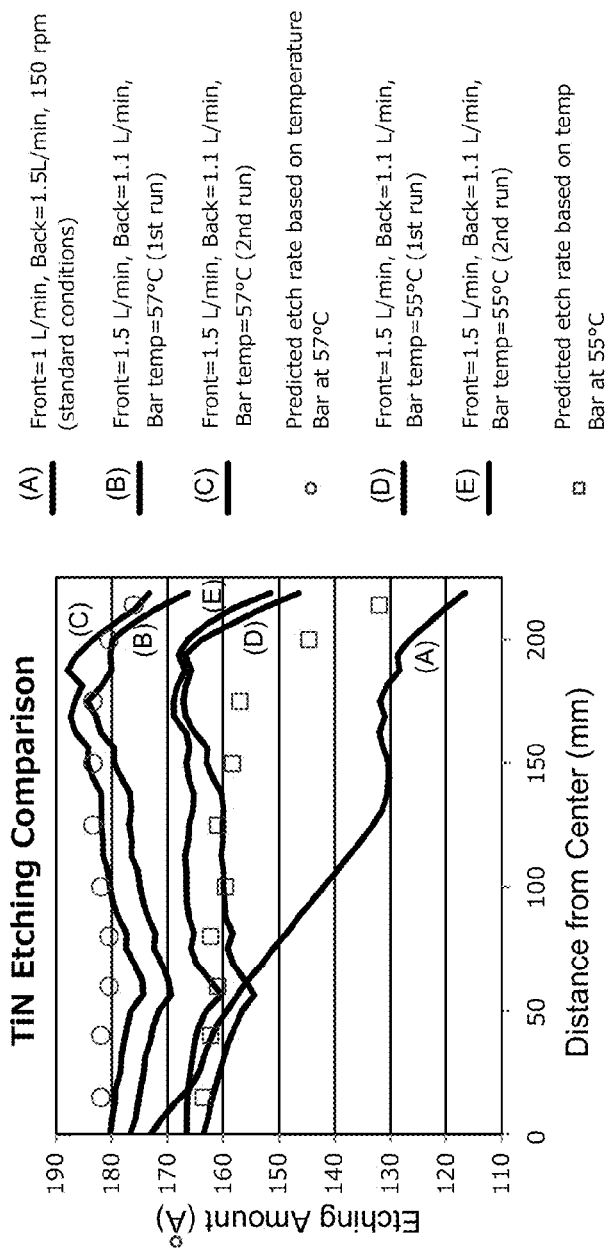
FIG. 5 shows etch uniformity as a function of substrate radius according to embodiments of the invention.

FIG. 5 shows etch uniformity as a function of substrate radius according to embodiments of the invention. The results in FIG. 5 show that etching processes that use front surface discharge nozzle and a backside bar nozzle show improved TiN film etching uniformity compared to etching processes that only use a front surface discharge nozzle. This may be attributed to better temperature uniformity across the substrate surface when using a front surface discharge nozzle and a backside bar nozzle. In the exemplary etching process in FIG. 5, the temperature of the chemical fluid in the discharge nozzle was 50 degrees C. and the temperature of the chemical fluid in the bar nozzle was 57 degrees C. The chemical fluid used was an oxidizing liquid containing hydrogen peroxide.

Figure 6:
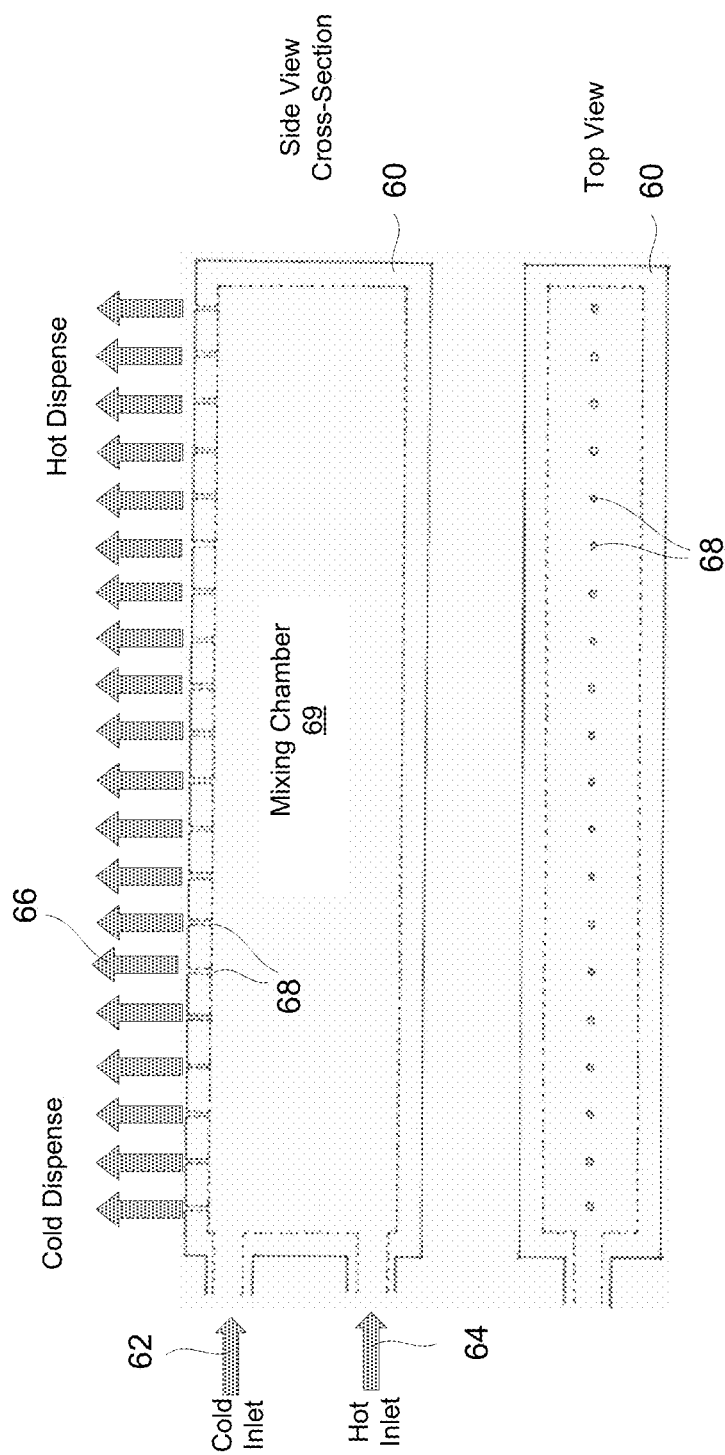
FIG. 6 schematically shows a bar nozzle containing two inlets for introducing a chemical fluid at different temperatures according to an embodiment of the invention.

FIG. 6 schematically shows a cross-sectional view of a bar nozzle 60 containing two inlets for introducing a chemical fluid at different temperatures into the bar nozzle 60. The bar nozzle 60 contains a mixing chamber 69 where the cold and hot chemical fluids 62, 64 mix and then the resulting chemical fluid 66 is dispensed through outlets 68 to a substrate surface (not shown) in a continuous temperature range from cold at one end to hot in the other end. Other embodiments contemplate the use of more than two inlets, for example three, four, or even more than four inlets. The inlets can be positioned at other locations on the bar nozzle 60 than is depicted in FIG. 6. In other examples, the two or more inlets may be used to introduce a chemical fluid with different properties other than, or in addition to, different temperatures. The different properties can, for example, include chemical concentration or chemical composition.

Figure 7:
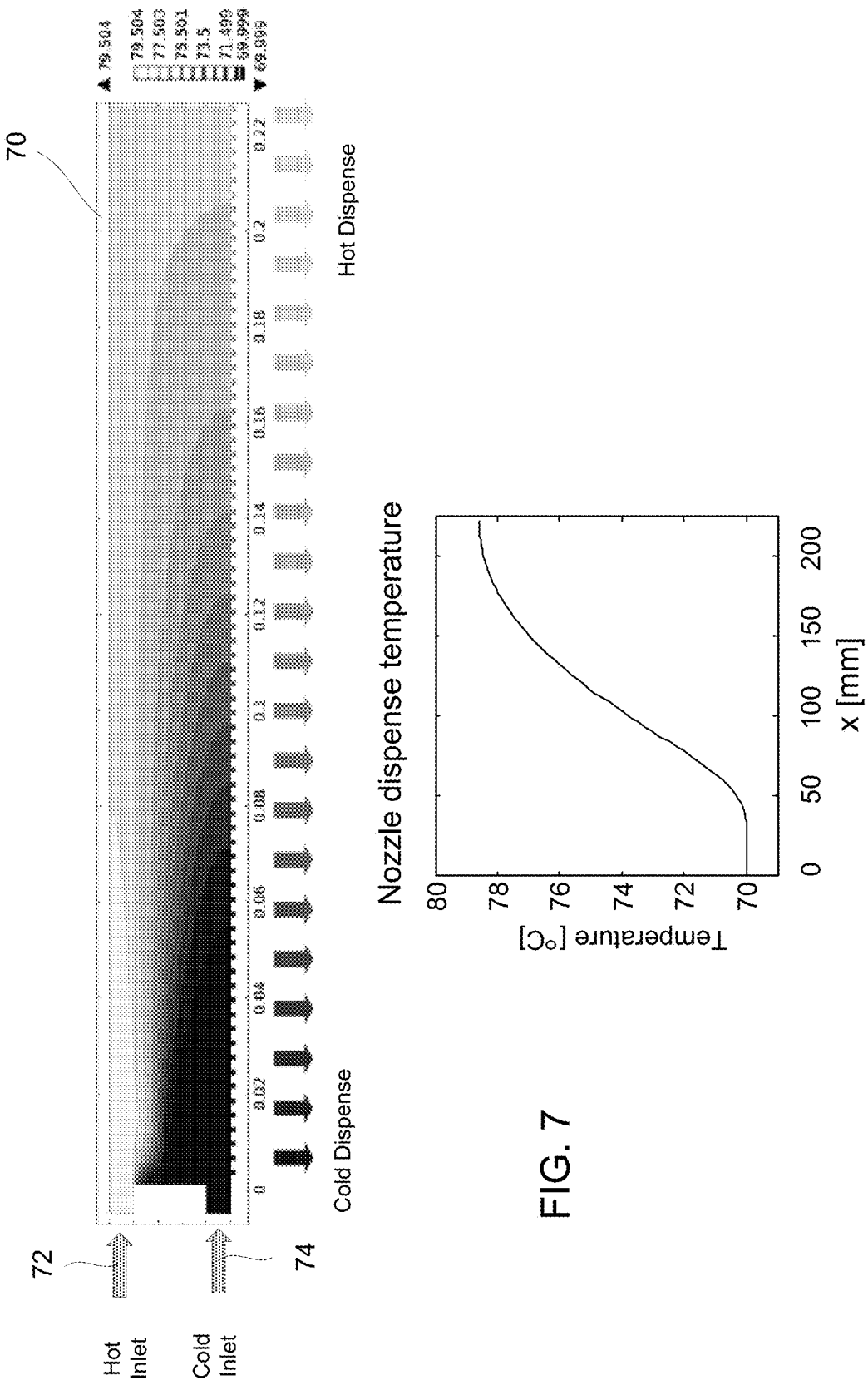
FIG. 7 shows simulated temperature distribution in a bar nozzle according to an embodiment of the invention.

FIG. 7 shows simulated temperature distribution in a bar nozzle 70 according to an embodiment of the invention. The bar nozzle 70 contained two inlets 72,74 for introducing a chemical fluid at different temperatures into the bar nozzle 70. The cold inlet temperature of the chemical fluid was 70 degrees C. and the hot inlet temperature of the chemical fluid was 80 degrees C. The temperature of a chemical fluid in the bar nozzle 70 increased from about 70 degrees C. at the center of substrate (left) to about 79 degrees C. at the edge of the substrate (right).

Figure 8A:
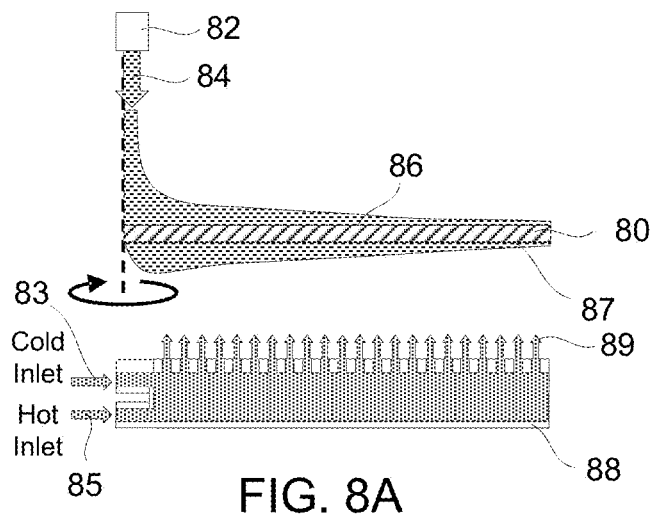
FIGS. 8A-8B are cross-sectional views schematically illustrating treating a substrate with a plurality of chemical fluids according to embodiments of the invention.

FIG. 8A is a cross-sectional view schematically illustrating treating a substrate 80 with a plurality of chemical fluids according to an embodiment. A first chemical fluid 84 is dispensed on the center of the front (upper) substrate surface 86 by a discharge nozzle 82 and a bar nozzle 88 dispenses a second chemical fluid 89 to a back surface 87 of the substrate 80 such that the outlet temperature of the second chemical fluid increases with the radial position of the substrate 80 (cold in center to hot at edge). The bar nozzle 80 contains two inlets 83, 85 for introducing a chemical fluid at different temperatures into the bar nozzle 80. Varying the dispense temperature from the bar nozzle 88 more closely counteracts the cooling of the chemical fluid as it flows across the substrate 80 on the front surface 86, compared to a bar nozzle that contains a chemical fluid with a substantially constant temperature.

Figure 8B:
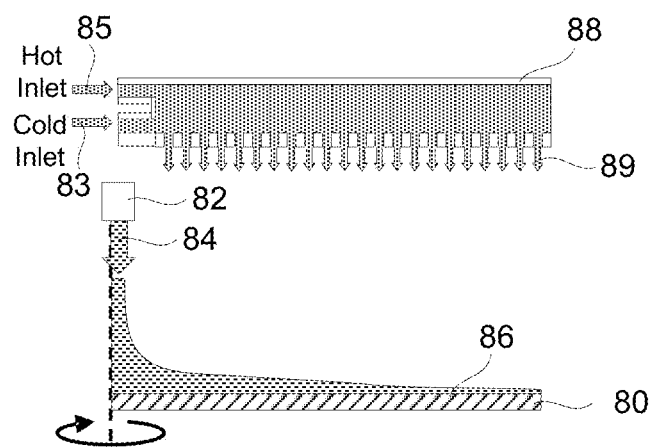

FIG. 8B is a cross-sectional view schematically illustrating treating a substrate with a plurality of chemical fluids according to an embodiment. A first chemical fluid 84 is dispensed on the center of the front (top) substrate surface 86 by a discharge nozzle 82 and a bar nozzle 88 dispenses a second chemical fluid 89 to the front substrate surface 86 such that the outlet temperature of the second chemical fluid 89 increases with the radial position of the substrate 80 (cold in center to hot at edge).

Figure 9C:
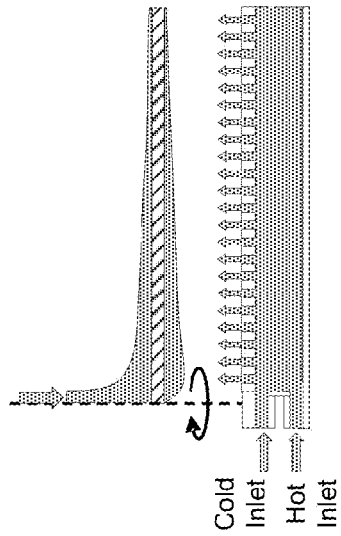
FIG. 9A-9C shows simulated temperature uniformity as a function of substrate radius for different methods of dispensing chemical fluids to a substrate.
Figure 9C:
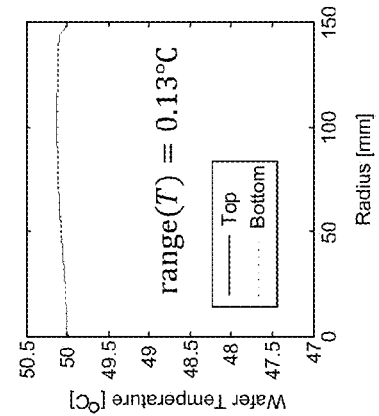
Figure 9B:
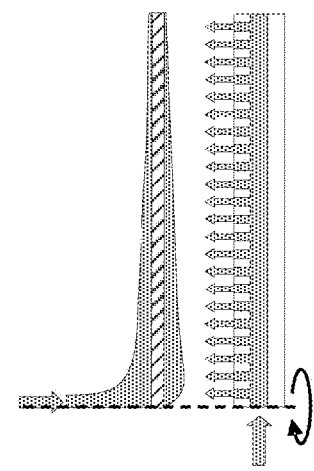
Figure 9B:
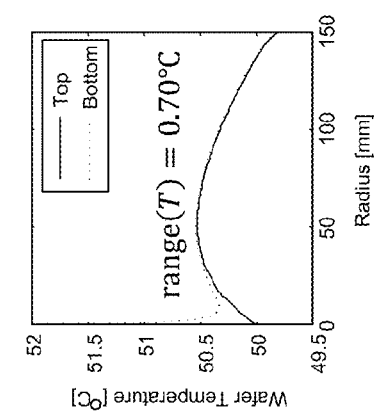
Figure 9A:
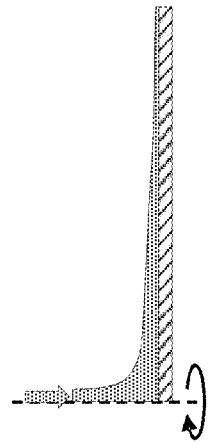
Figure 9A:
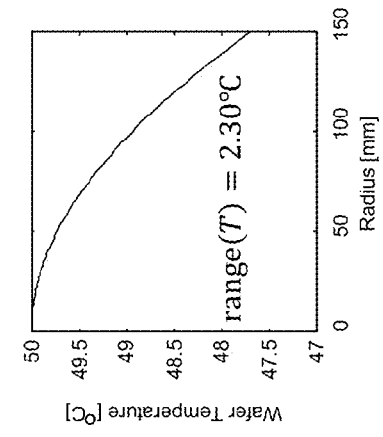

FIG. 9A-9C shows simulated temperature uniformity as a function of substrate radius for different methods of dispensing chemical fluids to a substrate. FIG. 9A shows the temperature uniformity using a discharge nozzle to supply a first chemical fluid to a front surface of the substrate. FIG. 9B shows temperature uniformity using a discharge nozzle to supply a first chemical fluid to a front surface of the substrate and a bar nozzle to supply a second chemical fluid to the back surface of the substrate. FIG. 9C shows temperature uniformity using a discharge nozzle to supply a first chemical fluid to a front surface of the substrate and a backside bar nozzle to supply a second chemical fluid with a radial temperature gradient (cold in center to hot at edge) to the back surface of the substrate. The simulations clearly show that variable dispense temperature from the backside discharge nozzle (FIG. 9C) greatly improves temperature uniformity across the substrate. The temperature range across the substrate was 2.3 degrees C. in FIG. 9A, 0.7 degrees C. in FIG. 9B, and 0.13 degrees C. in FIG. 9C.

Figure 10:
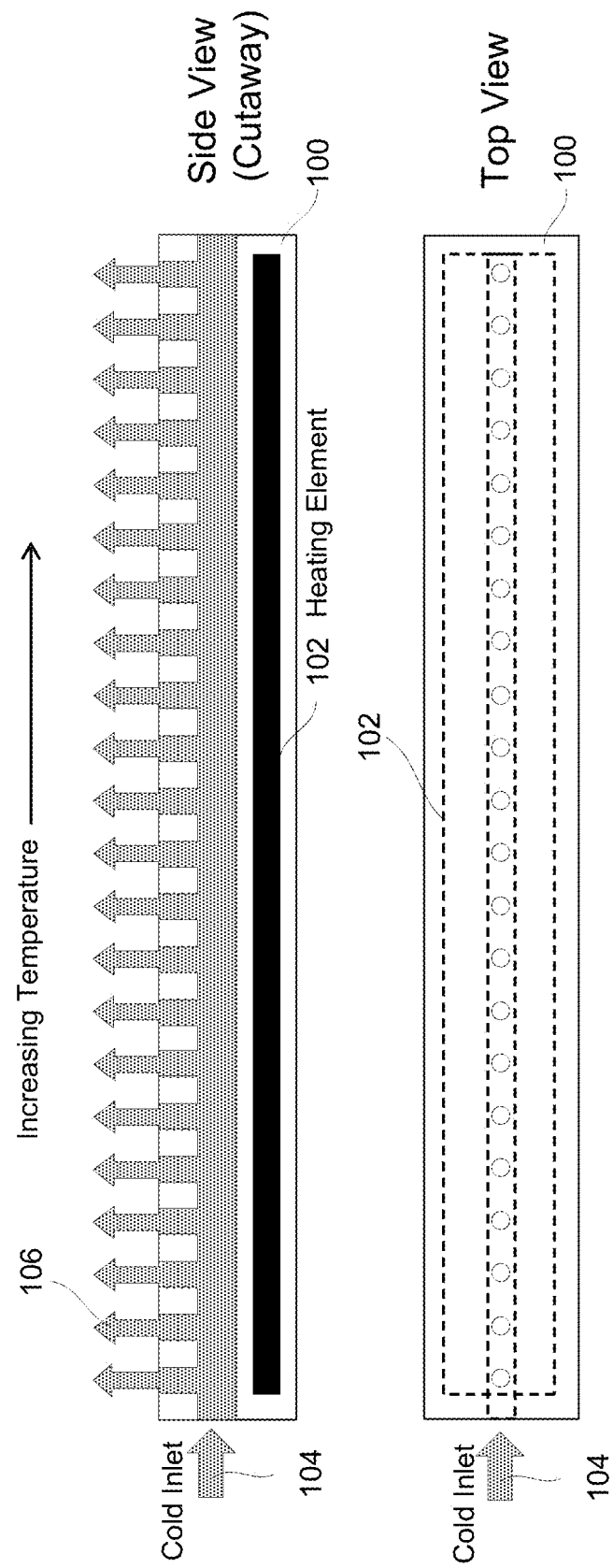
FIG. 10 schematically shows cross-sectional views of a bar nozzle containing a heater for heating a chemical fluid according to an embodiment of the invention.

FIG. 10 schematically shows cross-sectional views of a bar nozzle 100 containing a heater (heating element 102) for heating a chemical fluid 104 according to an embodiment of the invention. The bar nozzle 100 can contain an internal heating element 102, or a series of heating elements with individual controls, to dispense a chemical fluid 106 with a variable dispense temperature from the bar nozzle 100, where the dispense temperature increases from the center of the substrate to the edge of the substrate.

TABLE I provides a list of exemplary chemical fluids and fluid temperatures that may be used in embodiments of the invention.

TABLE I

| Liquid | Typical Temp [° C.] | Minimum Temp [° C.] | Maximum Temp [° C.] |
|---|---|---|---|
| $H_2O$ | 23 | 10 | 90 |
| $H_2O$ with gas | " | " | " |
| Hydrofluoric acid | 50 | 25 | 75 |
| HF + $HNO_3$ | " | " | " |
| Buffered HF ($NH_4F$ + HF) | " | " | " |
| HF + glycol mixture | " | " | " |
| TMAH (Tetramethylammonium hydroxide aqueous solution) | 75 | 50 | 90 |
| Sulfuric acid | 120 | 60 | 180 |
| Phosphoric acid | 180 | 100 | 200 |
| SPM ($H_2SO_4$ + $H_2O_2$) | 160 | 60 | 240 |
| Hydrogen peroxide | 23 | 10 | 90 |
| SPM ($H_2SO_4$ + $H_2O_2$) | " | " | " |
| SC1 ($NH_3$ + $H_2O_2$) | " | " | " |
| SC2 (HCl + $H_2O_2$) | " | " | " |
| Non-aqueous proprietary blends (i.e. based on solvents other than water) | 50 | 25 | 80 |
| Aqueous proprietary blends | 23 | 10 | 90 |

Exemplary parameters for a chemical fluid processing apparatus and chemical fluid processing method are described below.

In one embodiment, a distance between the bar nozzle and a substrate surface can be between 1 mm and 30 mm, between 1 mm and 20 mm, or between 5 mm and 20 mm. In one example, the distance can be about 5 mm.

In one embodiment, chemical fluid dispense flow rate can between about 100 mL/min and about 10 L/min, between about 200 mL/min and about 5 L/min, or between about 200 mL/min and about 2 L/min. In one example, the chemical fluid dispense rate can be about 1 L/min.

In one embodiment, a rotation speed of the substrate can be between about 25 RPM and about 4000 RPM, between about 50 RPM and about 1000 RPM, or between about 50 RPM and about 500 RPM. In one example, the rotation speed can be about 150 RPM.

In one embodiment, the substrate can be exposed to a chemical fluid for a time between about 10 seconds and about 15 minutes, between about 10 seconds and about 1 minute, or between about 30 seconds and about 1 minute.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A chemical fluid processing apparatus to treat a substrate with a plurality of chemical fluids such that substantially constant temperature is maintained across a substrate surface, the apparatus comprising:
   a substrate holding mechanism to hold the substrate;
   a rotating mechanism to rotate the substrate holding mechanism;
   a discharge nozzle above the substrate to supply a first chemical fluid at a first temperature to a front surface of the substrate;
   a first chemical fluid supply mechanism to supply the first chemical fluid to the discharge nozzle;
   a bar nozzle oriented in a radial direction of the substrate to supply a second chemical fluid at a second temperature to the front surface or a back surface of the substrate, the second temperature being higher than the first temperature; and
   a second chemical fluid supply mechanism to supply the second chemical fluid to the bar nozzle,
   wherein the bar nozzle comprises a plurality of outlets for discharging the second chemical fluid to a plurality of contacting places on the front surface or the back surface of the substrate at different distances from the center of the substrate, the second chemical fluid supply mechanism is configured to supply the second chemical fluid at different temperatures to at least two inlets of the bar nozzle, and the distance between adjacent outlets decreases along the radial direction from the center of the substrate to the edge of the substrate.

2. The chemical fluid processing apparatus of claim 1, wherein the second temperature of the second chemical fluid supplied from the bar nozzle increases along the radial direction from the center of the substrate to the edge of the substrate.

3. The chemical fluid processing apparatus of claim 1, wherein the bar nozzle further comprises a heater to heat the second chemical fluid to the second temperature.

4. The chemical fluid processing apparatus of claim 1, wherein within the bar nozzle the plurality of outlets are formed to proceed through a wall of the bar nozzle at an acute angle to the substrate.

5. The chemical fluid processing apparatus of claim 1, wherein within the bar nozzle the plurality of outlets are formed to proceed through a wall of the bar nozzle at an acute angle to a rotation direction of the substrate.

6. The chemical fluid processing apparatus of claim 1, wherein the second chemical fluid has a different chemical composition than the first chemical fluid.

7. The chemical fluid processing apparatus of claim 1, further comprising a second bar nozzle oriented in the radial direction of the substrate to supply a third chemical fluid to the front surface or the back surface of the substrate.

8. A chemical fluid processing apparatus to treat a substrate with a plurality of chemical fluids such that substantially constant temperature is maintained across a substrate surface, the apparatus comprising:
   a substrate holding mechanism to hold the substrate;
   a rotating mechanism to rotate the substrate holding mechanism;
   a discharge nozzle above the substrate to supply a first chemical fluid at a first temperature to a front surface of the substrate;
   a first chemical fluid supply mechanism to supply the first chemical fluid to the discharge nozzle;
   a bar nozzle below the substrate oriented in a radial direction of the substrate and extending substantially from a center of the substrate to an edge of the substrate to supply a second chemical fluid at a second temperature to a back surface of the substrate, the second temperature being higher than the first temperature; and
   a second chemical fluid supply mechanism to supply the second chemical fluid to the bar nozzle,
   wherein the bar nozzle comprises a plurality of outlets for discharging the second chemical fluid to a plurality of contacting places on the back surface of the substrate at different radial distances from the center of the substrate and with an increasing temperature radially from the center of the substrate to the edge of the substrate, and the radial distance between adjacent outlets decreases along the radial direction from the center of the substrate to the edge of the substrate.

9. The chemical fluid processing apparatus of claim 8, wherein the bar nozzle further comprises a heater to heat the second chemical fluid to the second temperature.

10. The chemical fluid processing apparatus of claim 8, wherein within the bar nozzle the plurality of outlets are formed to proceed through a wall of the bar nozzle at an acute angle to the substrate.

11. The chemical fluid processing apparatus of claim 8, wherein within the bar nozzle the plurality of outlets are formed to proceed through a wall of the bar nozzle at an acute angle to a rotation direction of the substrate.

12. The chemical fluid processing apparatus of claim 8, wherein the second chemical fluid has a different chemical composition than the first chemical fluid.

13. The chemical fluid processing apparatus of claim 8, further comprising a second bar nozzle above the substrate oriented in the radial direction of the substrate and extending substantially from a center of the substrate to an edge of the substrate to supply a third chemical fluid to the front surface of the substrate.

* * * * *